US011901473B2

United States Patent
Burger et al.

(10) Patent No.: US 11,901,473 B2
(45) Date of Patent: Feb. 13, 2024

(54) THERMOPHOTOVOLTAIC CELLS WITH INTEGRATED AIR-BRIDGE FOR IMPROVED EFFICIENCY

(71) Applicant: THE REGENTS OF THE UNIVERSITY OF MICHIGAN, Ann Arbor, MI (US)

(72) Inventors: Tobias Burger, Ann Arbor, MI (US); Byungjun Lee, Ann Arbor, MI (US); Dejiu Fan, Ann Arbor, MI (US); Andrej Lenert, Ann Arbor, MI (US); Stephen R. Forrest, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 17/232,243

(22) Filed: Apr. 16, 2021

(65) Prior Publication Data
US 2021/0328087 A1 Oct. 21, 2021

Related U.S. Application Data

(60) Provisional application No. 63/010,978, filed on Apr. 16, 2020.

(51) Int. Cl.
H01L 31/0735 (2012.01)
H01L 31/0687 (2012.01)
(Continued)

(52) U.S. Cl.
CPC .......... H01L 31/0687 (2013.01); C30B 25/04 (2013.01); C30B 25/22 (2013.01);
(Continued)

(58) Field of Classification Search
CPC .............. H01L 31/0735; H01L 31/056; H01L 31/02327; H01L 31/02165; H02S 10/30
See application file for complete search history.

(56) References Cited

U.S. PATENT DOCUMENTS 5,853,601 A 12/1998 Krishaswamy et al.
6,822,157 B2 11/2004 Fujioka
(Continued)

FOREIGN PATENT DOCUMENTS

| CN | 1926695 A | 3/2007 |
| CN | 101809755 B | 9/2014 |
| JP | 5615885 B2 | 10/2014 |

OTHER PUBLICATIONS

Omair ("Ultraefficient thermophotovoltaic power conversion by band-edge spectral filtering"), Applied Physical Sciences, 116 (31) 15356-15361 (Year: 2019).*

(Continued)

Primary Examiner — Angelo Trivisonno
(74) Attorney, Agent, or Firm — Harness, Dickey & Pierce, P.L.C.

(57) ABSTRACT

To reach high efficiencies, thermophotovoltaic cells must utilize the broad spectrum of a radiative thermal source. One promising approach to overcome this challenge is to have low-energy photons reflected and reabsorbed by the thermal emitter, where their energy can have another chance at contributing toward photogeneration in the cell. However, current methods for photon recuperation are limited by insufficient bandwidth or parasitic absorption, resulting in large efficiency losses relative to theoretical limits. This work demonstrates nearly perfect reflection of low-energy photons (~99%) by embedding an air layer within the TPV cell. This result represents a four-fold reduction in parasitic absorption relative to existing TPV cells. As out-of-band reflectance approaches unity, TPV efficiency becomes nearly (Continued)

insensitive to cell bandgap and emitter temperature. Accessing this regime unlocks a range of possible materials and heat sources that were previously inaccessible to TPV energy conversion.

8 Claims, 9 Drawing Sheets

(51) Int. Cl.
    *H01L 31/18*     (2006.01)
    *G03F 7/00*     (2006.01)
    *H01L 31/0232*     (2014.01)
    *H01L 31/0264*     (2006.01)
    *H01L 33/00*     (2010.01)
    *C30B 25/04*     (2006.01)
    *C30B 25/22*     (2006.01)
    *H01L 31/043*     (2014.01)

(52) U.S. Cl.
    CPC ........ *G03F 7/0005* (2013.01); *H01L 31/0264* (2013.01); *H01L 31/02327* (2013.01); *H01L 31/043* (2014.12); *H01L 31/0735* (2013.01); *H01L 31/1852* (2013.01); *H01L 31/1896* (2013.01); *H01L 33/0093* (2020.05)

(56) References Cited

U.S. PATENT DOCUMENTS

| 7,719,752 B2 | 5/2010 | Sampsell et al. |
| 2009/0101192 A1* | 4/2009 | Kothari ............ H01L 31/02165 136/246 |
| 2019/0013366 A1 | 1/2019 | Forrest et al. |

OTHER PUBLICATIONS

Burger ("Thin-Film Architectures with High Spectral Selectivity for Thermophotovoltaic Cells"), ACS Photonics 2018, 5, 2748-2754 (Year: 2018).*

Lee, K., Lee, J., Mazor, B. et al. Transforming the cost of solar-to-electrical energy conversion: Integrating thin-film GaAs solar cells with non-tracking mini-concentrators. Light Sci Appl 4, e288 (2015). https://doi.org/10.1038/lsa.2015.61.

Sharma, R. & Haberer, Elaine & Meier, Cedrik & Hu, E. & Nakamura, S.. (2005). Vertically oriented GaN-based air-gap distributed Bragg reflector structure fabricated using band-gap-selective photoelectrochemical etching. Applied Physics Letters. 87. 051107-051107. 10.1063/1.2008380.

Kyusang Lee, "Compound Semiconductor-Based Thin-Film and Flexible Optoelectronics". University of Michigan, 2015.

Pfeffer, Florian, Eisenlohr, Johannes, Basch, Angelika, Hermle, Martin, Lee, Benjamin G., and Goldschmidt, Jan Christoph. Systematic analysis of diffuse rear reflectors for enhanced light trapping in silicon solar cells. United States: N. p., 2016. Web. doi:10.1016/j.solmat.2016.03.028.

Vidya Ganapati, Chi-Sing Ho, Eli Yablonovitch. Air Gaps as Intermediate Selective Reflectors to Reach Theoretical Efficiency Limits of Multibandgap Solar Cells. IEEE Journal of Photovoltaics, 2014.

* cited by examiner

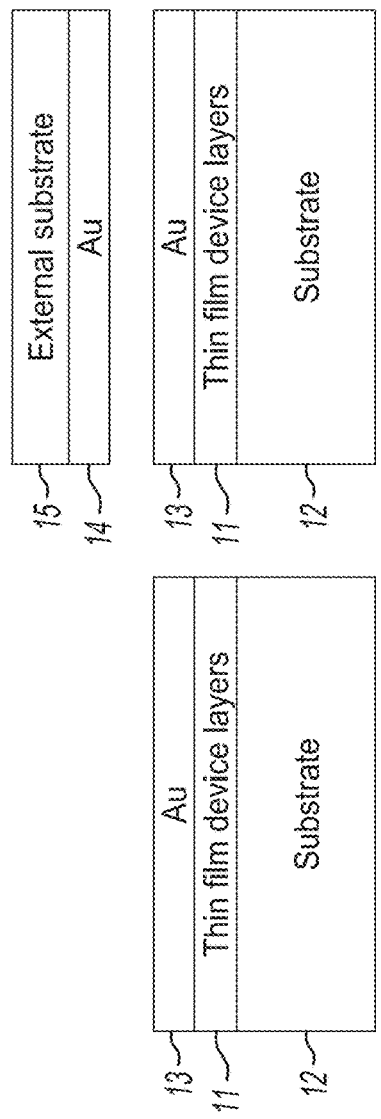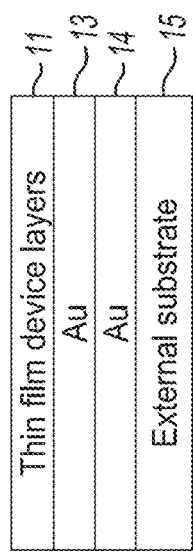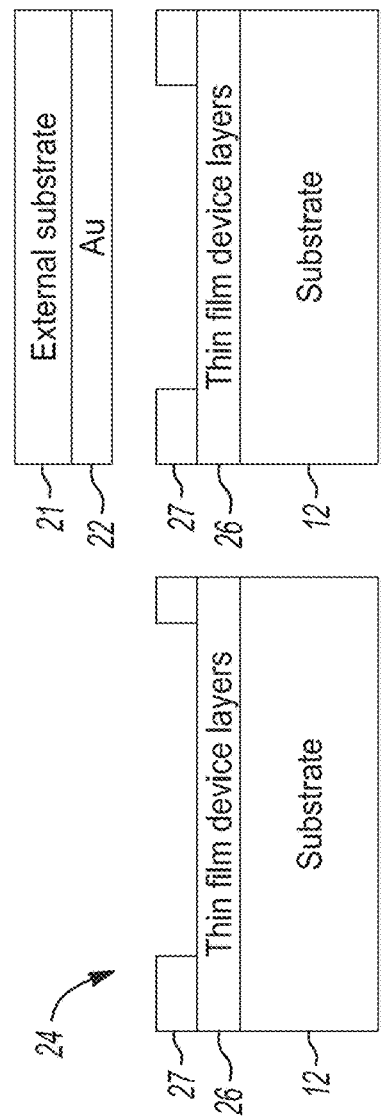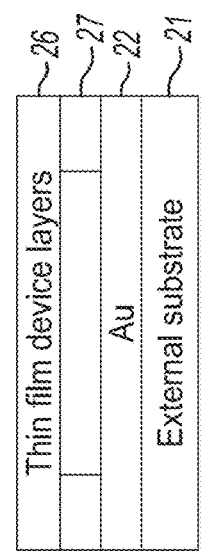

THERMOPHOTOVOLTAIC CELLS WITH INTEGRATED AIR-BRIDGE FOR IMPROVED EFFICIENCY

CROSS-REFERENCE TO RELATED APPLICATIONS

This application claims the benefit of U.S. Provisional Application No. 63/010,978, filed on Apr. 16, 2020. The entire disclosure of the above application is incorporated herein by reference.

GOVERNMENT CLAUSE

This invention was made with government support under IIP1820395 awarded by the National Science Foundation and W911NF-19-1-0279 awarded by the U.S. Army Research Office. The government has certain rights in the invention.

FIELD

The present disclosure relates to techniques for fabricating optoelectronic devices with integrated air-bridges for improved efficiency.

BACKGROUND

Thermophotovoltaics utilize locally emitted thermal radiation to generate electricity. Similar to solar photovoltaics (PVs), sufficiently high energy photons (so-called in-band photons) radiated from a thermal emitter excite electronic transitions in the cell. Photogenerated charge carriers are subsequently separated and extracted as electricity. The challenge in thermophotovoltaic (TPV) cells is that most thermal emitters operate at temperatures between 1000 and 2500 K. In this temperature range, a large fraction of out-of-band (OOB) photons carry energy below the semiconductor bandgap and are thus unavailable for exciting electronic transitions.

Unlike solar PV cells, however, OOB thermal radiation in a TPV can be recycled back to the closely positioned emitter using spectral control, enabling recovery of the unconverted energy. High OOB cell reflectance can be engineered through use of a back-surface reflector (BSR), front-surface filter (FSF), or both. The development of a Si TPV cell with 95% OOB reflectance has been reported, enabling a power conversion efficiency of 29% using a 2300 K broadband emitter. More recently, a thin-film $In_{0.53}Ga_{0.47}As$ (InGaAs) cell exhibiting 29.1% efficiency and 94.6% OOB reflectance, paired with a 1480 K graphite emitter, was reported. This demonstration represents the highest reported efficiency for any TPV to date. Nevertheless, selective reflectors, including metallic back-surface reflectors, Bragg/plasma filters, and photonic crystals, have yet to exceed 95% OOB reflectance. At this level, the largest losses relative to theoretical limits are due to spectral inefficiencies. 5% OOB reflectance loss, although seemingly small, lowers TPV efficiency by ~10% absolute due to the importance of low-energy photons.

This section provides background information related to the present disclosure which is not necessarily prior art.

SUMMARY

This section provides a general summary of the disclosure, and is not a comprehensive disclosure of its full scope or all of its features.

In one aspect, an optoelectronic device with integrated air-bridges is presented. The optoelectronic device includes: a substrate; a reflecting layer disposed on the substrate; and a thermophotovoltaic cell disposed on the reflecting layer. The thermophotovoltiac cell is further comprised of multiple device layers forming a p-n junction. A spacer layer is disposed between the reflecting layer and the thermophotovoltaic cell, such that the spacer layer includes one or more cavities which extend between the reflecting layer and the thermophotovoltaic cell.

In another aspect, a method is presented for fabricating an optoelectronic. The method includes: growing active device layers onto a parent substrate, where the active device layers form a p-n junction; depositing a spacer layer onto an exposed surface of the active device layers; patterning the spacer layer to form one or more holes in the spacer layer; depositing a reflecting material onto a host substrate; bonding the reflecting material to the spacer layer, wherein the one or more holes in the spacer layer form one or more gaps between the reflecting material and the active device layers; and removing the parent substrate from the active device layers, thereby forming the optoelectronic device.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1A-1C are schematics depicting a conventional fabrication process for an optoelectronic device.

FIGS. 2A-2C are schematics depicting an improved fabrication process for an optoelectronic device with integrated air-bridge.

Corresponding reference numerals indicate corresponding parts throughout the several views of the drawings.

DETAILED DESCRIPTION

Figure 3A:
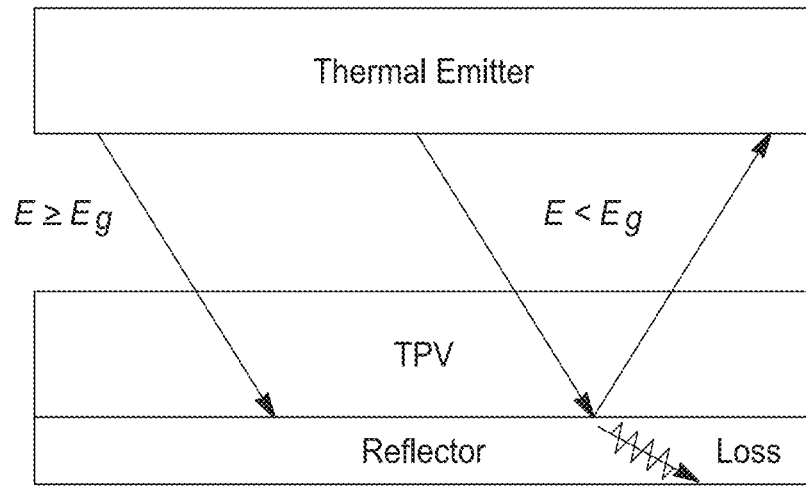
FIGS. 3A and 3B are schematics of the energy flow in a conventional thin-film thermophotovoltaic (TPV) and a thin-film thermophotovoltaic with integrated air-bridge, respectively.
Figure 3B:
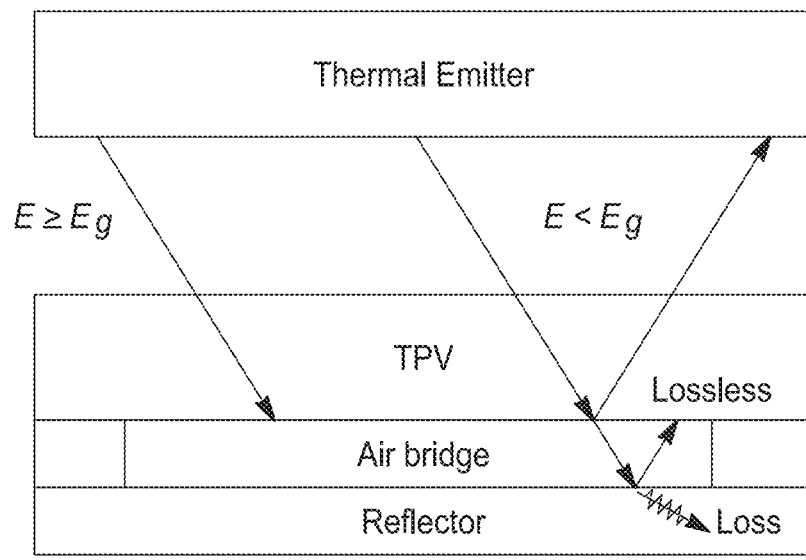
Figure 3C:
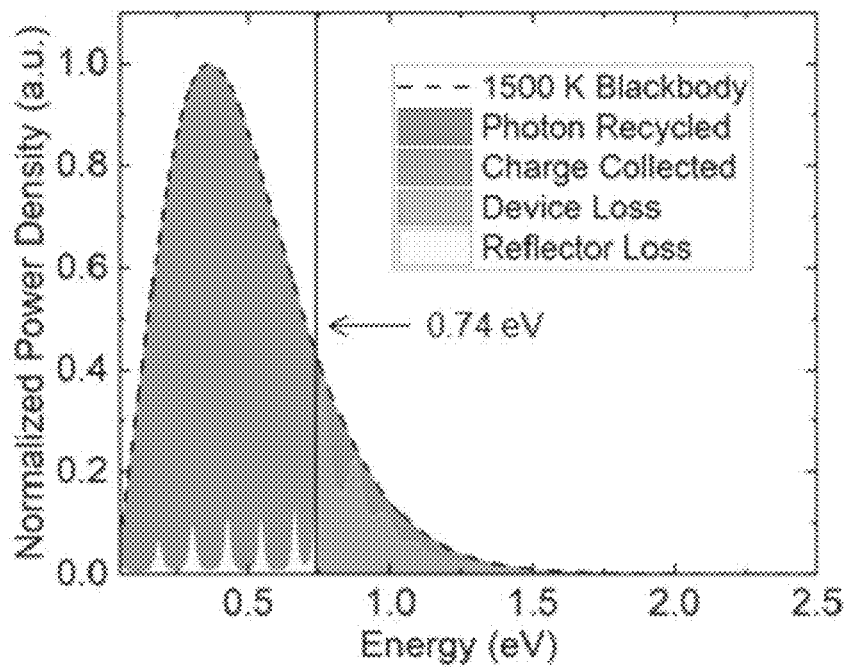
FIGS. 3C and 3D are graphs showing the power distribution of a conventional TPV and a TPV with an integrated air-bridge, respectively.

Example embodiments will now be described more fully with reference to the accompanying drawings.

Thin film inorganic optoelectronic devices with back side reflector are routinely fabricated in the manner shown in FIGS. 1A-1C. Thin film active layers 11 are first grown on a parent substrate 12 as seen in FIG. 1A. The thin film active layers 11 are then coated with a reflective material 13, such as gold. With reference to FIG. 1B, a host substrate 15 is also coated with a reflective material 14, such as gold. The structure on the host substrate 15 is then bonded to the structure on the parent substrate 12. In FIG. 1C, the parent substrate 12 is removed via epitaxial lift-off (sacrificial layer needed), or substrate etching (etching stop layer needed), or another suitable process. Thin film devices, such as a thermophotovoltaic (TPV) cell, can be fabricated on the transferred thin film active layers 11. As further described below, the TPV epitaxial structure fabricated with the above method achieved a sub-bandgap reflectance of close to 95%. Ideally, the structure could achieve a TPV power conversion efficiency of 43% under 1500 K blackbody illumination.

To further enhance the reflectance and boost the performance of optoelectronic devices, this disclosure introduces a method that creates an air-bridge between the thin-film active layers and the reflector as seen in FIGS. 2A-2C. The optoelectronic device 20 is comprised generally of a reflector 22 and a thermophotovoltaic cell 24 supported on a host substrate 21. In one example, the reflector 22 is gold although other types of metals and reflective materials are contemplated by this disclosure.

The thermophotovoltaic cell 24 is formed from active device layers 26. In this example, the active device layers 26 form a p-n junction. Of note, a spacer layer 27 is positioned in between the reflector 22 and the active device layers 26. The spacer layer 27 includes one or more cavities (or holes) extending between the reflector 22 and the active device layers 26. In an example embodiment, the one or more cavities are filled with air. In other embodiments, the one or more cavities may be filled with magnesium fluoride or other types of semiconductor materials. While particular reference is made to a thermophotovoltaic cell, it is readily understood that the fabrication technique described herein is applicable to other types of optoelectronic devices as well.

With reference to FIG. 2A, the active device layers 26 are grown on a parent substrate 12. In one example, the exposed surface of the active device layers 26 is patterned with grids of bonding materials (for example Au) which also form the spacer layer 27. This device structure is then bonded to reflector 22, for example using cold bonding, as seen in FIG. 2B. In this way, an air gap is formed between the thin film device layers 26 and the reflector 22 as best seen in FIG. 2C. The parent substrate 12 is then removed, for example via epitaxial lift-off (ELO) or substrate etching. For epitaxial lift-off, a sacrificial layer may be used in between the parent substrate 12 and the device active layers 26. For substrate etching, an etching stop layer is preferably between the parent substrate 12 and the device active layers 26. Thin film devices can then be fabricated on (or from) the transferred active device layers.

During operation, the thermophotovoltaic cell with an integrated air bridge absorbs most of the in band radiation to generate electricity while serving as a nearly perfect mirror with ~99% OOB reflectance. This high reflectance enables a TPV power conversion efficiency exceeding 31% using a 1500 K emitter. This approach eliminates parasitic absorption in the dielectric and maximizes the refractive index mismatch at each interface. Furthermore, TPVs enter a fundamentally different regime when OOB reflectance approaches unity. While the trade-off between bandgap and photocurrent must be made in conventional devices with <95% OOB reflectance, the spectral efficiency becomes nearly insensitive to the bandgap or to the temperature of the thermal emitter at 99% OOB reflectance, potentially allowing for the exploitation of low-cost semiconductors, such as silicon, that have heretofore been impractical.

Figure 3D:
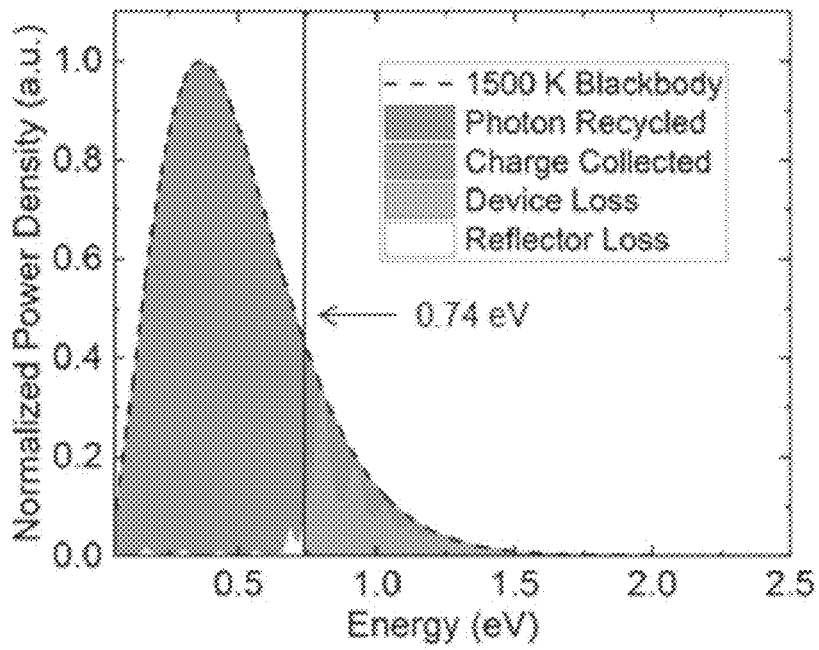

Referring to FIGS. 3A-3D, the benefits of an air-bridge architecture are apparent from a theoretical comparison of energy flows and losses in a TPV utilizing a conventional thin-film design to a TPV with an air-bridge cell. In FIG. 3A, a hot thermal source radiates photons with a broad, blackbody spectrum. Photons with energy (E) greater than the TPV semiconductor bandgap (Eg) are absorbed and generate current, while photons with E<Eg travel through the TPV, are reflected by the back surface reflector, and re-absorbed by the emitter. Conventional reflectors, such as gold, introduce a loss of ~5% at the semiconductor/reflector interface for every reflection/re-absorption cycle. In contrast, when an air cavity is integrated within the cell (FIG. 3B), photons with E<Eg experience lossless Fresnel reflection at the TPV/air interface. Photons that transmit through this interface are then reflected by the reflector with <2% reflectance loss at the air/reflector interface. When integrated over the emitter spectrum, OOB absorption by the conventional thin-film cell is 4.7%, representing the primary source of loss (see FIG. 3C). Other loss pathways include carrier collection (~2.5%). The absorption oscillations are Fabry-Perot modes formed in the cavity between the reflector and the TPV. In comparison, the air-bridge cell loses only 1.1% of power to OOB absorption (FIG. 3D). From these calculations, both cells have a similar energy transfer efficiency in the in-band region (61.1% for conventional vs. 61.8% for air-bridge); whereas, the air-bridge structure effectively reduces the OOB losses by more than four times compared to the conventional cell.

Figure 4:
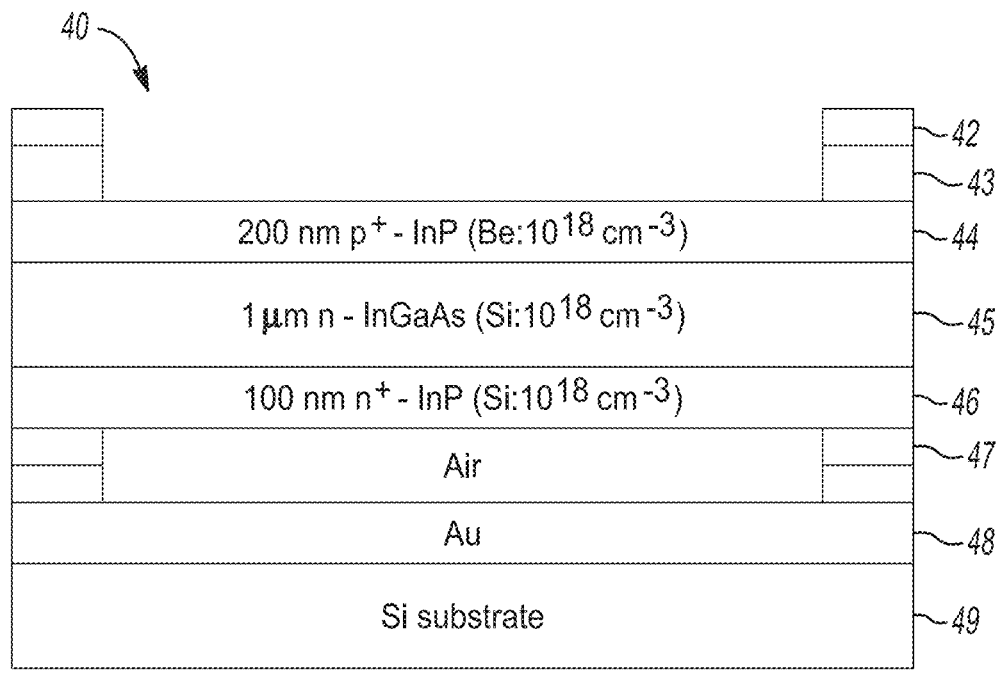
FIG. 4 is a cross sectional view of an example embodiment of a TPV with integrated air-bridge.

FIG. 4 depicts an example embodiment of an optoelectronic device 40 with an integrated air-bridge. In this example, a lattice-matched, inverted P-n-N heterostructure thermophotovoltaic (TPV) cell is epitaxially grown on a 350 μm thick (100) InP parent substrate (not shown) using GENxplore Molecular Beam Epitaxy (Veeco Corp., MN, 55127). The heterostructure includes a 200 nm undoped InP buffer layer 42, 200 nm Be-doped ($1\times10^{18}$ cm$^{-3}$) In$_{0.53}$Ga$_{0.47}$As (InGaAs) contact layer 43, 200 nm Be-doped ($1\times10^{18}$ cm$^{-3}$) InP front window layer 44, 1 μm nm Si-doped ($1\times10^{17}$ cm-3) InGaAs absorption layer 45, 100 nm Si-doped ($1\times10^{18}$ cm$^{-3}$) InP back window layer 46, and 100 nm Si-doped ($1\times10^{18}$ cm$^{-3}$) InGaAs contact layer 47. These dimensions and materials are merely illustrative and not intended to be limiting.

The heterostructure TPV cell is supported by a host substrate 49. More specifically, a reflecting layer of gold 48 is disposed on the host substrate 49. The TPV cells is in turn disposed onto the reflecting layer 48. In the example embodiment, the host substrate is silicon although other types of materials are contemplated as well. As further described below, the parent substrate is removed to form the optoelectronic device 40.

Figure 5A:
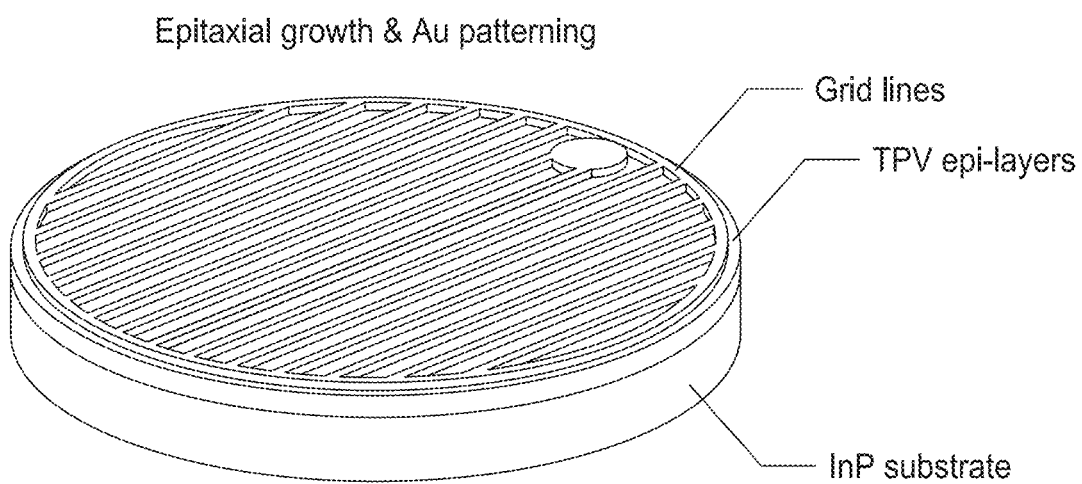
FIGS. 5A-5D are diagrams further illustrating the fabrication process of the TPV with the integrated air-bridge.

The fabrication process for the optoelectronic device 40 is described in more detail with reference to FIGS. 5A-5D. Active device layers for the TPV cell are grown epitaxially grown on the parent substrate. In the example embodiment, the active device layers include a layer of indium gallium arsenide sandwiched between layers of indium phosphide. The active deice layers may also include anode and cathode layers. The native oxide on the epitaxial surface is removed in buffered HF for 90 seconds and rinsed in de-ionized (DI) water for 10 seconds. All layers are photolithographically patterned, for example using LOR 3A (MicroChem Corp., MA, 01581) and SPR 220 3.0 (MicroChem Corp., MA, 01581) bilayer photoresist. Cathode contacts (e.g., 10 nm Ti/590 nm Au, E-beam evaporated) are patterned first with 2.95/2.85 mm outer/inner diameter ring contact filled with 8 μm wide metal grids as seen in FIG. 5A. The grid-to-grid spacing is 80 μm, giving an ~10% grid coverage (i.e. a 90% geometric fill factor). The sample is then soaked in H3PO4:H2O2:H2O=1:1:8 solution for 20 seconds to remove the 100 nm n-type InGaAs contact layer, while the contact layer underneath the cathode contact metal is protected to minimize the contact resistance.

Figure 5B:
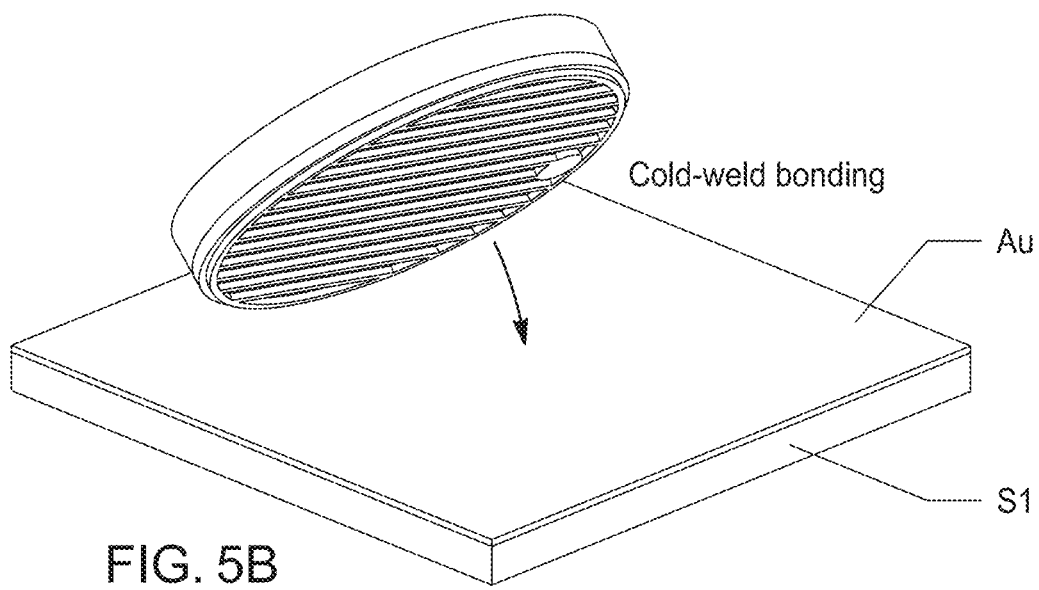

Next, the TPV cell is bonded to the host substrate. In FIG. 5B, the host substrate is coated with the reflecting layer. In the example embodiment, the reflecting layer is 5 nm Ti/300 nm Au (E-beam evaporated). In particular, the TPV cell is bonded to the host substrate by applying heat (150° C.) and pressure (10 MPa) for 5 minutes using an EVG 510 wafer bonder (e.g., EV Group Inc., NY, 12203).

Figure 5C:
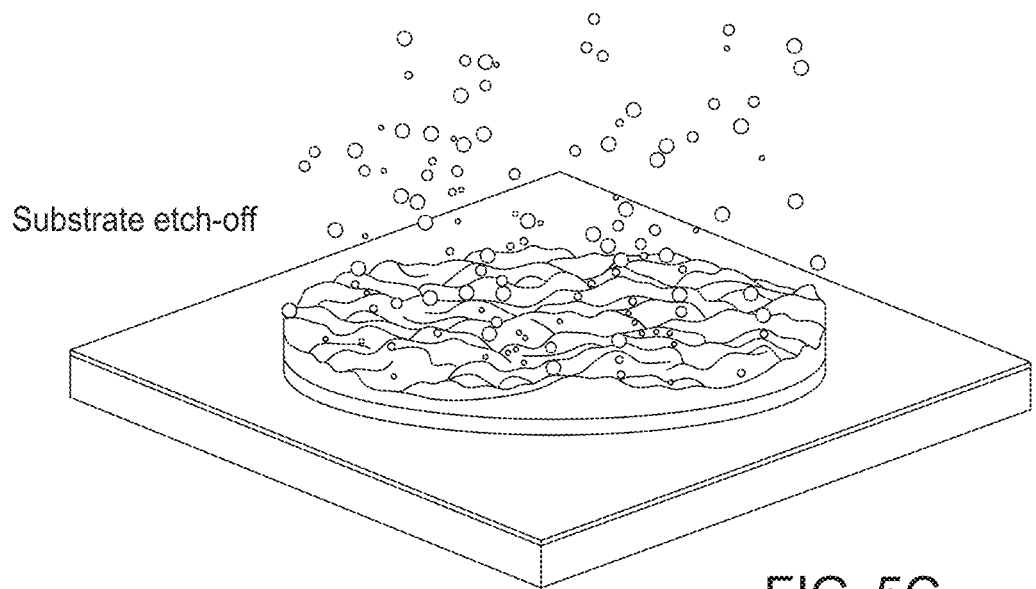
Figure 5D:
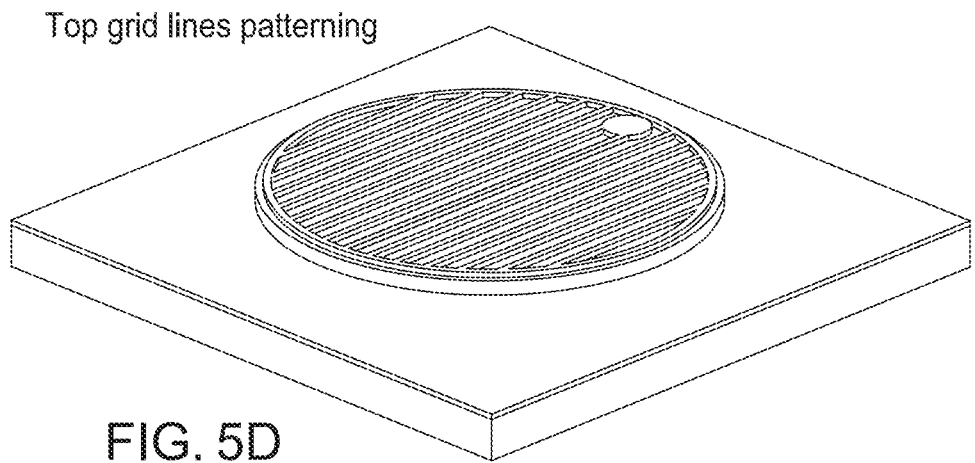

With reference to FIG. 5C, the InP substrate is removed by immersion in dilute HCl (HCl:H2O=1:1) for 16 hours, thereby leaving only the active TPV epitaxial layers suspended over air bridges and supported by the buried grid lines. In other embodiments, this destructive substrate removal step can be substituted by non-destructive epitaxial lift-off (ND-ELO) to recycle the costly InP growth substrate. That is, the parent substrate is removed from the active device layers using an epitaxial lift-off procedure. The TPV mesa (3 mm diameter) is subsequently patterned as seen in FIG. 5D by alternatively soaking the sample in InGaAs etchant (citric acid:H2O2=4:1) and InP etchant (HCl:H2O=1:1). Finally, the top anode contact (10 nm Ti/30 nm Pt/500 nm Au, E-beam evaporated) that is coincident with the buried cathode contact is patterned, and the 200 nm p-type InGaAs contact layer is removed using citric acid:H2O2=4:1 for 2 minutes. These particular methods are merely illustrative and not intended to be limiting.

The fabrication procedure provides two significant advantages. First, the air cavity thickness can be accurately controlled within nanometers by the thickness of buried gold grid lines. Second, all the air cavities are encapsulated through Au—Au cold-weld bonding. This protects the TPV bottom surface from damage by the HCl substrate etchant.

Figure 6A:
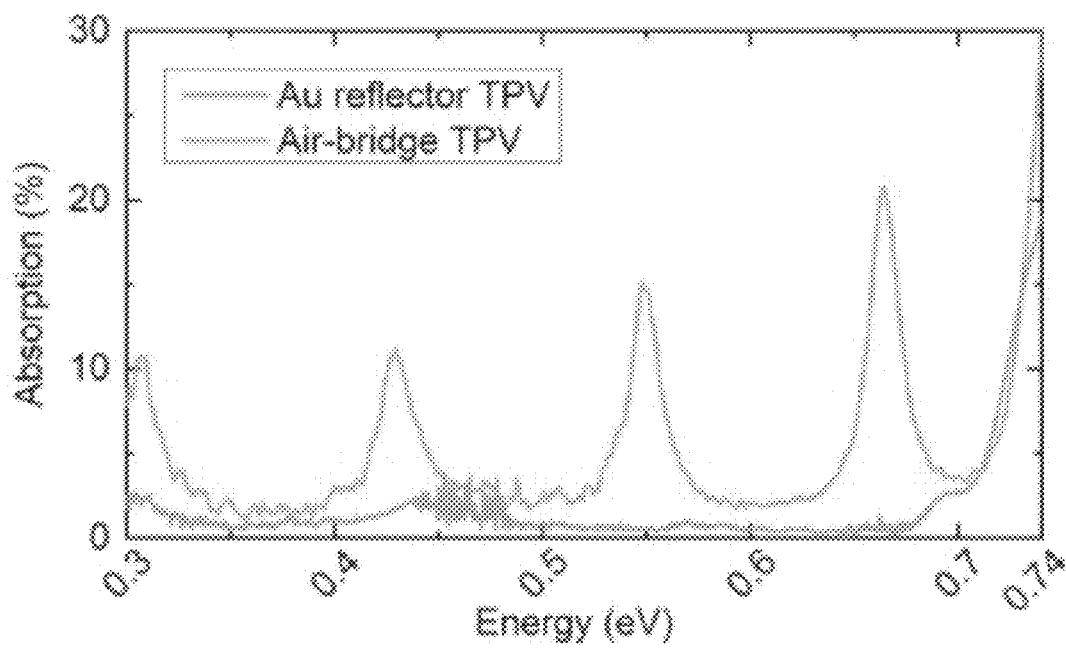
FIG. 6A is graph showing the spectral properties of the reflector (green) and air-bridge (blue) for out-of-band (OOB, E<Eg=0.74 eV) absorption.
Figure 6B:
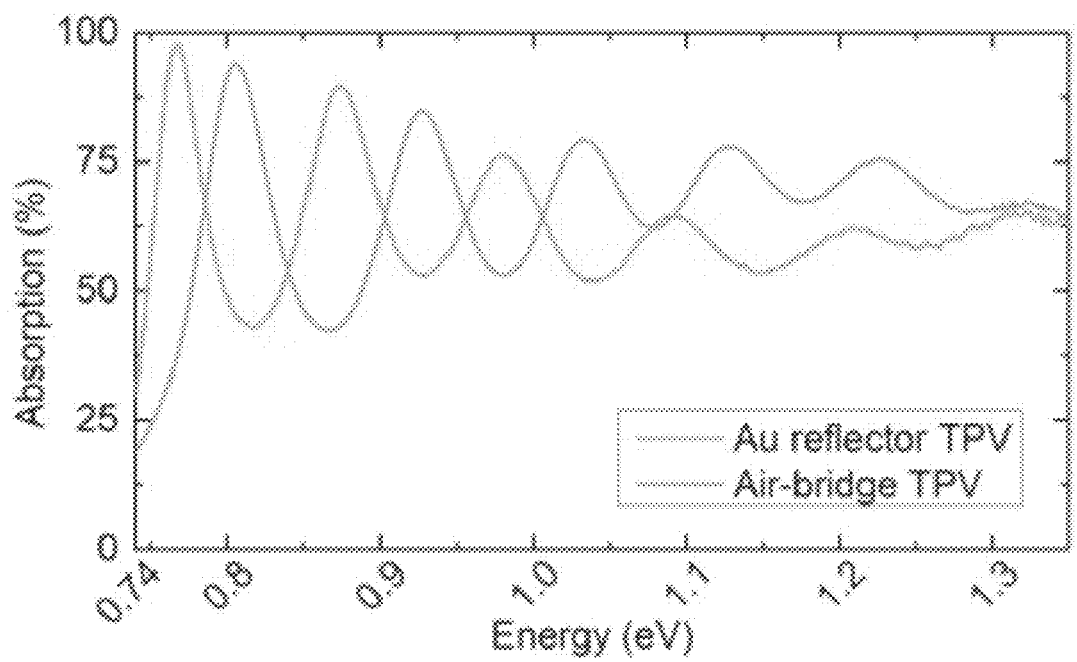
FIG. 6B is a graph showing the spectral properties of the reflector (green) and air-bridge (blue) for in-band (IB, $E \geq E_g$) absorption.
Figure 6C:
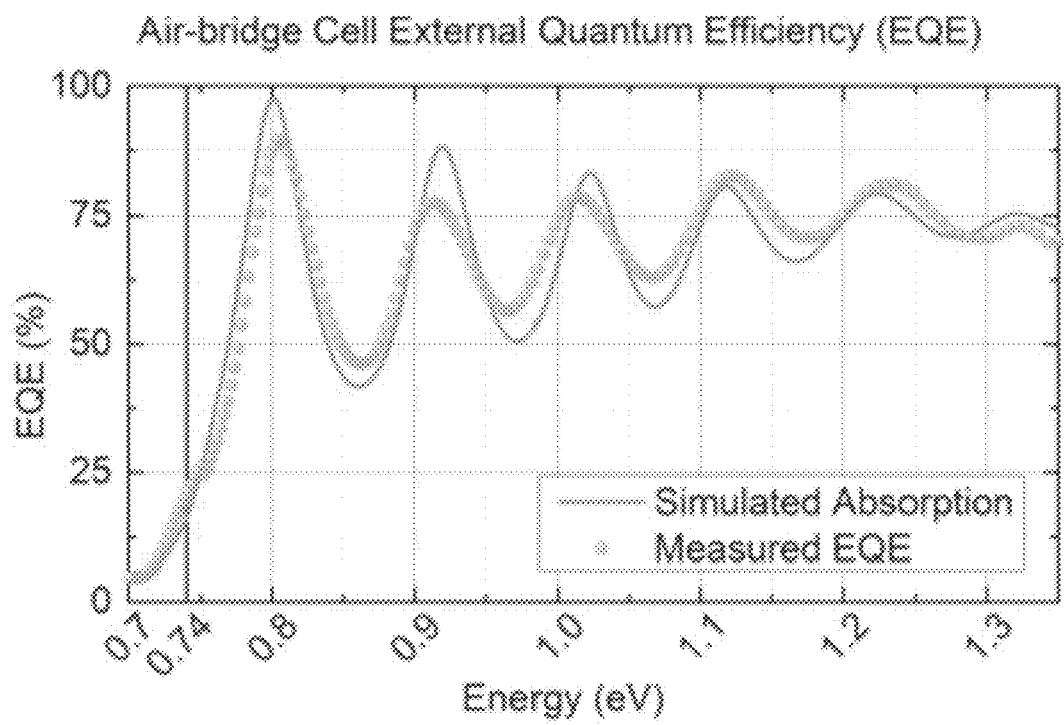
FIG. 6C is a graph showing Simulated absorption (line) and measured external quantum efficiency (data) of the air-bridge TPV.

The spectral properties of the reflector and air-bridge cells were characterized using FT-IR spectroscopy. As weighted by the 1500 K blackbody emission spectrum, the average OOB power reflectance is 95.3% for the Au reflector cell, and 98.5% for the air-bridge cell as seen in FIG. 6A. The average in-band power absorption is 63.6% and 61.2% for the Au reflector and the air-bridge cells, respectively (see FIG. 6B). Dispersion calculations for the Au reflector cell show that substantial absorption occurs in inactive layers due to waveguide modes and a surface plasmon polariton mode supported along the metal-semiconductor interface. FIG. 6C presents the simulated absorption spectrum and the measured in band external quantum efficiency spectrum for normal incident light on the air-bridge TPV. From these results and the measured absorption, one obtains an average IQE=98.4% for the air-bridge cell.

Figure 6D:
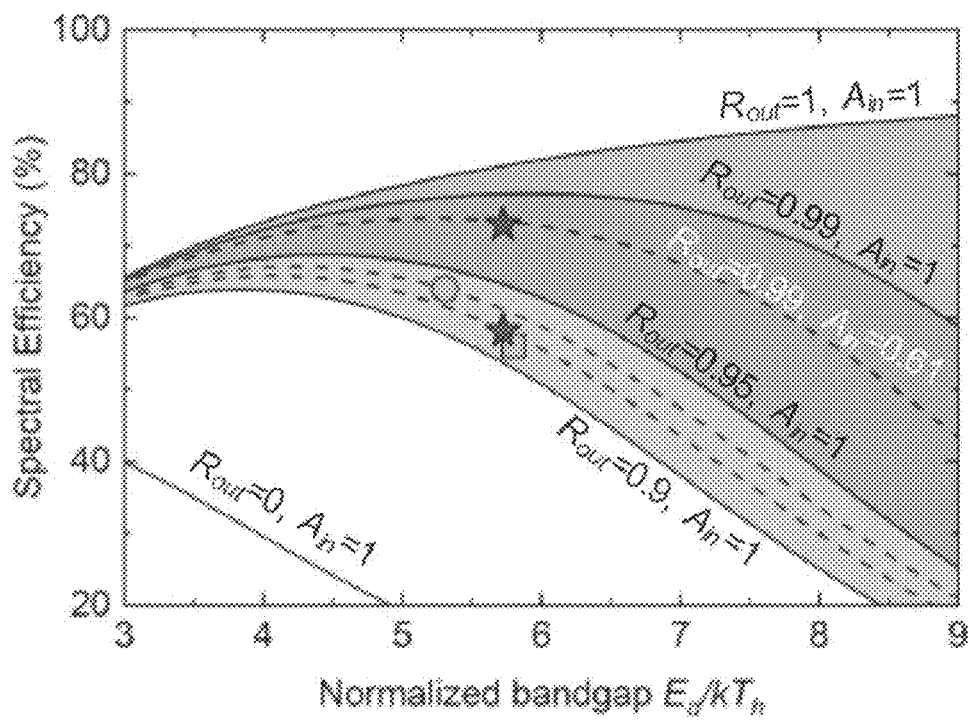
FIG. 6D is a graph showing measured spectral efficiency of the reflector and air-bridge TPVs (stars); the simulated spectral efficiencies are calculated for various OOB reflectance ($R_{out}$) and IB absorptions ($A_{in}$) shown by lines.

The spectral enhancements of the air-bridge architecture are accurately described by the spectral efficiency, SE, which captures the combined effects of the enhancement of in band and suppression of OOB radiative transport. One finds SE=58.1% and 72.9% for the Au reflector and the air-bridge TPV cells, respectively (FIG. 6D, denoted by stars). The dashed curve through the top red star represents simulated SE with an in band absorption of $A_{in\#}$=0.61 and OOB reflectance of $R_{o\%\&}$=0.99, consistent with measurements of the air-bridge cell. Within the common range of source temperatures, OOB loss dominates with increasing bandgap. However, when $R_{o\%\&}$>0.99 (orange region), this dependence vanishes, suggesting that the cell design becomes insensitive to $E_g$ and emitter temperature. Thus, the nearly perfect reflectance of the air-bridge design may allow low cost materials like Si to be used as TPV cells while maintaining a high SE at relatively low emitter temperatures (<2000 K).

The power conversion efficiency (PCE) is defined by:

$$PCE = \frac{P_{electrical}}{P_{incident} - P_{reflected}}$$

where $P_{electrical}$ is the electrical power generated, $P_{incident}$ is the incident power, and $P_{reflected}$ is the power reflected by the cell. Here, $P_{electrical}=V_{OC} \cdot I_{SC} \cdot FF$, where $V_{OC}$ is the open-circuit voltage, $I_{SCI}$ is short-circuit current, and FF is the fill factor. The electrical power generated under illumination can be obtained directly from the cell current-voltage (I-V) characteristics while the incident and reflected power can be calculated from the spectral emissivity of the cell and emitter.

Figure 7A:
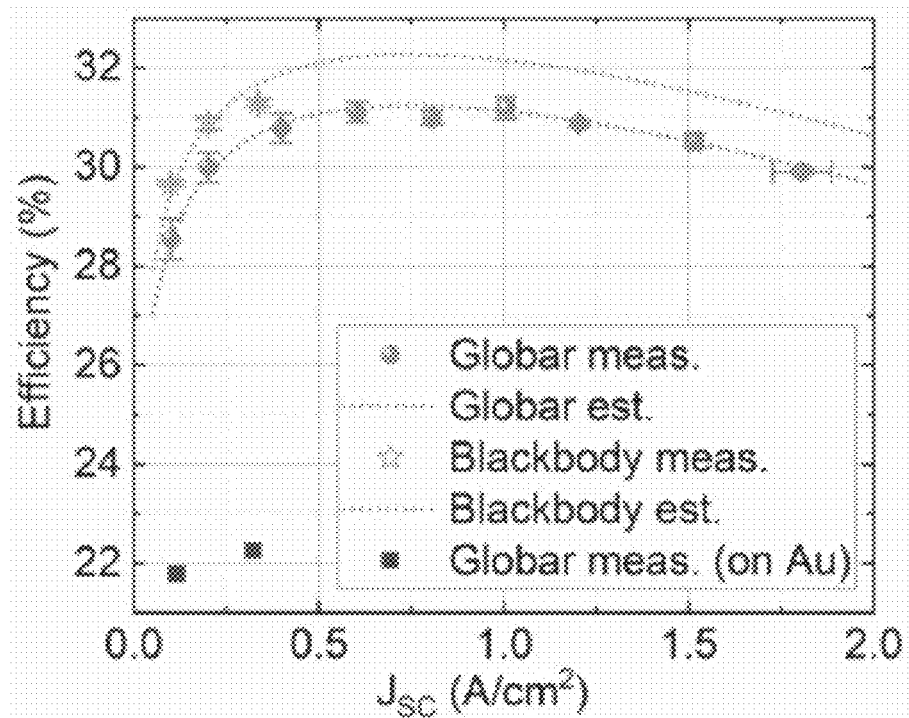
FIG. 7A is a graph showing power conversion efficiency vs. short circuit current density ($J_{sc}$) of the reflector (squares) and the air-bridge TPV (circles) under 1500 K SiC globar illumination, and power conversion efficiency of air-bridge TPV under 1473 K true blackbody illumination (stars).

The PCE of each cell under various illumination conditions is shown in FIG. 7A. The maximum PCE of the Au reflector cell is 22.3% at 323 mA/cm² under illumination by a globar emitter at 1500 K (view factor VF=0.162), whereas the air-bridge device exhibits PCE=31.2±0.2% at 1006 mA/cm² (VF=0.507). The PCE of the air-bridge cell exhibits >8% absolute improvement compared to the same cell fabricated on the Au reflector at a similar photocurrent under globar illumination. Given that these two cells have similar in band absorption (~60%), this improvement is primarily attributed to the reduction of OOB absorptance loss from ~5% to ~1%. The air-bridge TPV cell under illumination from a true blackbody source with emissivity >0.99 at 1473 K is also measured, achieving a maximum PCE=31.3±0.1%, at $J_{8f}$=33 mA/cm² (VF=0.134). Also, the performance of the air-bridge cell at higher blackbody illumination levels is modeled by fitting the measured, dark I-V characteristics to the diode equation. To within error, the measurement results agree with simulations that predict a maximum PCE=32.3% at $J_{8f}$=750 mA/cm².

Figure 7B:
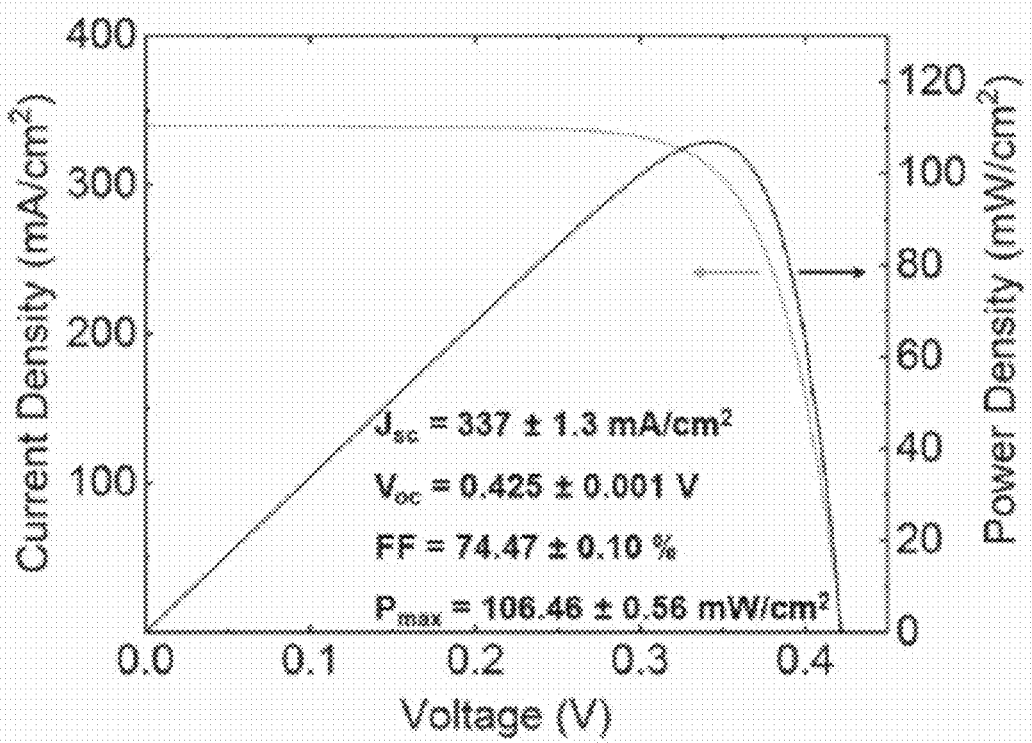
FIG. 7B is a graph showing current density-voltage and power density-voltage curves of the air-bridge TPV at maximum measured power conversion efficiency.
Figure 7C:
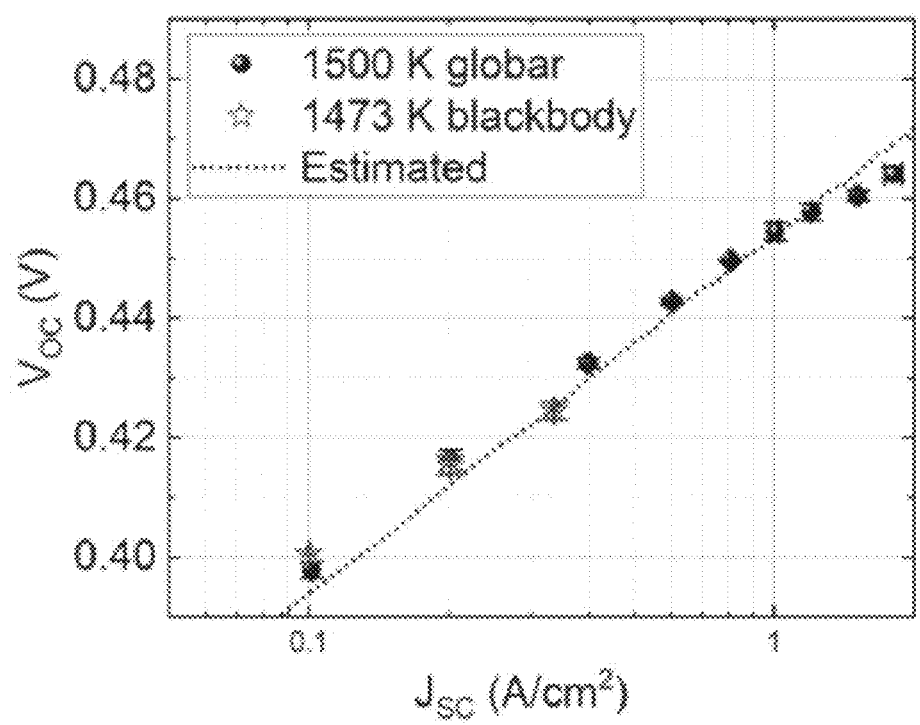
FIG. 7C is a graph showing measured open circuit voltage ($V_{oc}$) of the air-bridge TPV under 1500 K globar (black circles) and 1473 K true blackbody (stars) illumination.
Figure 7D:
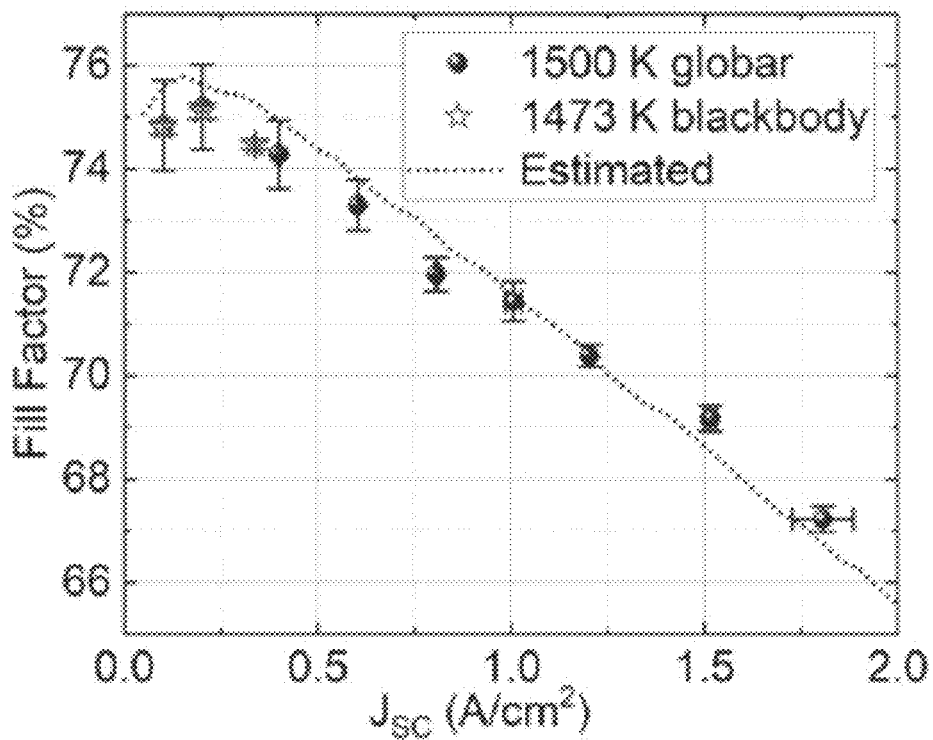
FIG. 7D is a graph showing fill factor (FF) of the air-bridge TPV under 1500 K globar (blue circles) and 1473 K true blackbody (stars) illumination.

The measured, voltage-dependent current density and power density at the highest measured efficiency (using the 1473 K blackbody source) are provided in FIG. 7B. One find $J_{SC}$=337 mA/cm$^2$, $V_{OC}$=0.425 V, FF=74.47%, and the maximum power output $P_{MAX}$=106.46 mW/cm$^2$. Results for the air-bridge cell using the 1500 K globar and 1473 K true blackbody source in FIG. 7C indicate that $V_{OC}$ increases linearly with log($J_{SC}$), except at the highest currents where cell heating may become significant. FF increases at relatively low $J_{SC}$ (<200 mA/cm$^2$) and drops dramatically with increasing $J_{SC}$ due to series resistance, $R_s$ (see, FIG. 7D).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An optoelectronic device, comprising:
   a substrate;
   a reflector disposed on the substrate; and
   a thermophotovoltaic cell bonded to the reflector and configured to receive thermal radiation incident thereon, wherein the thermophotovoltaic cell is comprised of active device layers and a spacer layer, such that the spacer layer is positioned in between the reflector and the active device layers, and the spacer layer includes a cavity formed between the active device layers and the reflector, and the cavity in the spacer layer is filled with air, wherein the spacer layer and reflector operate to reflect photons having energy less than band gap of materials comprising the thermophotovoltaic cell.

2. The optoelectronic device of claim 1 wherein the reflector is gold.

3. The optoelectronic device of claim 1 wherein the active device layers form a p-n junction.

4. The optoelectronic device of claim 1 wherein the active device layers include a layer of indium gallium arsenide sandwiched between layers of indium phosphide.

5. An optoelectronic device, comprising:
   a substrate;
   a reflecting layer configured to reflect thermal radiation and disposed on the substrate;
   a thermophotovoltaic cell disposed on the reflecting layer, wherein the thermophotovoltaic cell is comprised of multiple device layers forming a p-n junction; and
   a spacer layer disposed between the reflecting layer and the thermophotovoltaic cell, wherein the spacer layer includes one or more cavities which extend between the reflecting layer and the thermophotovoltaic cell, and the one or more cavities in the spacer layer are filled with air, wherein the spacer layer and reflector operate to reflect photons having energy less than band gap of materials comprising the thermophotovoltaic cell.

6. The optoelectronic device of claim 5 wherein the reflecting layer is comprised of gold.

7. The optoelectronic device of claim 5 wherein the multiple device layers include a layer of indium gallium arsenide sandwiched between layers of indium phosphide.

8. The optoelectronic device of claim 5 wherein the thermophotovoltaic cell is bonded to the reflecting layer using cold weld bonding.

* * * * *

UNITED STATES PATENT AND TRADEMARK OFFICE
CERTIFICATE OF CORRECTION

PATENT NO. : 11,901,473 B2  
APPLICATION NO. : 17/232243  
DATED : February 13, 2024  
INVENTOR(S) : Tobias Burger et al.

Page 1 of 1

It is certified that error appears in the above-identified patent and that said Letters Patent is hereby corrected as shown below:

In the Specification

At Column 1, Line number 14-18, "This invention was made with government support under IIP1820395 awarded by the National Science Foundation and W911NF-19-1-0279 awarded by the U.S. Army Research Office. The government has certain rights in the invention." should be --This invention was made with government support under W911NF-19-1-0279 awarded by the Army Research Laboratory – Army Research Office. The government has certain rights in the invention.--

Signed and Sealed this  
Seventh Day of January, 2025

Derrick Brent  
*Acting Director of the United States Patent and Trademark Office*